(12) United States Patent
Wang et al.

(10) Patent No.: US 8,246,749 B2
(45) Date of Patent: Aug. 21, 2012

(54) SUBSTRATE PROCESSING APPARATUS AND SEMICONDUCTOR DEVICE PRODUCING METHOD

(75) Inventors: Jie Wang, Toyama (JP); Ryuji Yamamoto, Kodaira (JP); Sadao Nakashima, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 678 days.

(21) Appl. No.: 11/989,488

(22) PCT Filed: Jul. 20, 2006

(86) PCT No.: PCT/JP2006/314422
§ 371 (c)(1),
(2), (4) Date: Aug. 13, 2009

(87) PCT Pub. No.: WO2007/013355
PCT Pub. Date: Feb. 1, 2007

(65) Prior Publication Data
US 2009/0311873 A1    Dec. 17, 2009

(30) Foreign Application Priority Data

Jul. 26, 2005 (JP) .................................. 2005-215788
Mar. 14, 2006 (JP) .................................. 2006-069454

(51) Int. Cl.
*C23C 16/44* (2006.01)
*H01L 21/31* (2006.01)

(52) U.S. Cl. ............ 118/733; 219/428; 432/9; 438/478; 427/96.8; 427/255.11

(58) Field of Classification Search .................. 118/715, 118/726, 733; 219/432, 390, 428; 438/478; 432/9; 427/248.1, 255.11, 96.8
See application file for complete search history.

(56) References Cited

U.S. PATENT DOCUMENTS

| | | | |
|---|---|---|---|
| 4,526,534 A * | 7/1985 | Wollmann | 432/11 |
| 5,441,570 A * | 8/1995 | Hwang | 118/725 |
| 5,484,484 A * | 1/1996 | Yamaga et al. | 118/719 |
| 5,622,566 A * | 4/1997 | Hosaka et al. | 118/723 VE |
| 5,632,820 A * | 5/1997 | Taniyama et al. | 118/724 |
| 5,902,406 A * | 5/1999 | Uchiyama et al. | 118/724 |
| 6,030,457 A * | 2/2000 | Shimazu et al. | 118/715 |
| 6,235,121 B1 * | 5/2001 | Honma et al. | 118/730 |
| 6,251,189 B1 * | 6/2001 | Odake et al. | 118/715 |
| 6,752,874 B2 * | 6/2004 | Shim et al. | 118/719 |
| 2001/0051214 A1 | 12/2001 | Tahara | |
| 2002/0168877 A1 | 11/2002 | Taniyama et al. | |
| 2004/0265020 A1 * | 12/2004 | Aruga | 399/329 |
| 2005/0053890 A1 | 3/2005 | Takata et al. | |
| 2009/0311873 A1 * | 12/2009 | Wang et al. | 438/758 |
| 2010/0050945 A1 * | 3/2010 | Morita et al. | 118/733 |

(Continued)

FOREIGN PATENT DOCUMENTS
JP    1/241819 A    9/1989
(Continued)

*Primary Examiner* — Mary Wilczewski
(74) *Attorney, Agent, or Firm* — Birch, Stewart, Kolasch & Birch, LLP (57) ABSTRACT

Disclosed is a substrate processing apparatus, including a reaction tube to process a substrate therein, wherein the reaction tube includes an outer tube, an inner tube disposed inside the outer tube, and a support section to support the inner tube, the inner tube and the support section are made of quartz or silicon carbide, and a shock-absorbing member is provided between the support section and the inner tube.

18 Claims, 8 Drawing Sheets

U.S. PATENT DOCUMENTS

| | | | |
|---|---|---|---|
| 2010/0162952 A1 * | 7/2010 | Yamazaki | 118/692 |
| 2012/0006268 A1 * | 1/2012 | Ozaki et al. | 118/733 |

FOREIGN PATENT DOCUMENTS

| | | |
|---|---|---|
| JP | 7-142418 A | 6/1995 |
| JP | 2000-216149 A | 8/2000 |
| JP | 2001-267255 A | 9/2001 |
| JP | 2002-280371 A | 9/2002 |
| JP | 2002-343782 A | 11/2002 |
| JP | 2004-221150 A | 8/2004 |
| JP | 2004-319979 A | 11/2004 |

* cited by examiner

SUBSTRATE PROCESSING APPARATUS AND SEMICONDUCTOR DEVICE PRODUCING METHOD

FIELD OF THE INVENTION

The present invention relates to a substrate processing apparatus and a semiconductor device producing method, and more particularly, to a vertical type CVD (Chemical Vapor deposition) apparatus using self-cleaning gas having a halogen gas or film forming processing gas such as DCS (dichlorosilane), and a semiconductor device producing method having a step of processing a substrate using the CVD apparatus.

DESCRIPTION OF THE RELATED ART

Figure 9:
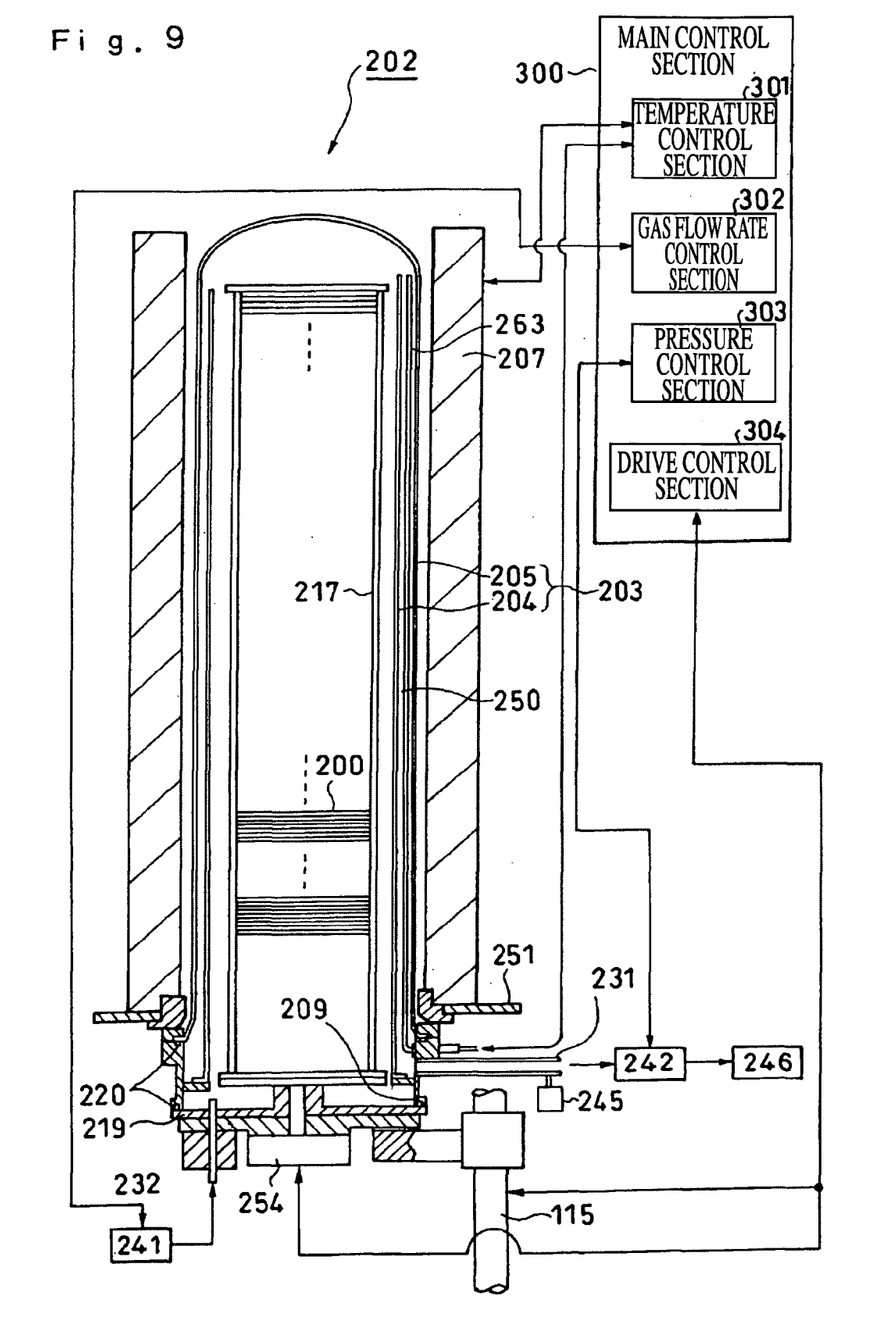
FIG. 9 is a schematic vertical sectional view for explaining a conventional vertical type pressure reducing CVD apparatus.

In a conventional vertical type CVD apparatus, as shown in FIG. 9, a furnace opening comprises quartz reaction tubes 204 and 205, and a metal flange 209.

The reason why metal parts are conventionally used for a long time for the furnace openings is that the quartz material is easily broken off and its durability is inferior.

However, when processing gas having halogen atoms is frequently used at a high temperature, if metal is used for the furnace opening, there is a problem that it is difficult to control metal contamination.

SUMMARY OF THE INVENTION

It is, therefore, a main object of the present invention to provide a substrate processing apparatus having a furnace opening structure which can prevent or suppress metal contamination and which has excellent durability even when processing gas having corrosive halogen atoms is used, and to provide a semiconductor device producing method which is suitably applied to the substrate processing apparatus.

According to one aspect of the present invention, there is provided a substrate processing apparatus, comprising a reaction tube to process a substrate therein, wherein
the reaction tube comprises an outer tube, an inner tube disposed inside the outer tube, and a support section to support the inner tube,
the inner tube and the support section are made of quartz or silicon carbide, and
a shock-absorbing member is provided between the support section and the inner tube.

According to another aspect of the present invention, there is provided a substrate processing apparatus, comprising a reaction tube to process a substrate therein, wherein
the reaction tube comprises an outer tube, an inner tube disposed inside the outer tube, and a support section to support the inner tube, and
a shock-absorbing member is provided between the support section and the inner tube, the shock-absorbing member being made of a material which is deformed or damaged by a force smaller than a force by which materials of the support section and the inner tube are deformed or damaged.

According to still another aspect of the present invention, there is provided a producing method of a semiconductor device, comprising:
loading a substrate into a reaction tube, the reaction tube comprising an outer tube, an inner tube disposed inside the outer tube, and a support section to support the inner tube, the inner tube and the support section being made of quartz or silicon carbide, and a shock-absorbing member being provided between the support section and the inner tube;
forming a film on the substrate by supplying film-forming gas into the reaction tube using a CVD method; and
unloading the substrate on which the film is formed from the reaction tube.

DESCRIPTION OF THE PREFERRED EMBODIMENTS

Preferred embodiments of the present invention provides a substrate processing apparatus, comprising a reaction tube to process a substrate therein, wherein the reaction tube comprises an outer tube, an inner tube disposed inside the outer tube, and a support section to support the inner tube, the inner tube and the support section are made of quartz or silicon carbide, and a shock-absorbing member is provided between the support section and the inner tube.

Preferably, the shock-absorbing member is made of a material which is deformed or damaged by a force smaller than a force by which quartz is deformed or damaged.

Preferably, the shock-absorbing member is made of a material whose hardness is smaller than that of quartz.

Preferably, the shock-absorbing member is made of a material including carbon or a material including silicon.

Preferably, the shock-absorbing member is made of at least one material selected from a group consisting of graphite, glassy carbon and graphite whose surface is covered with glassy carbon.

Preferably, the shock-absorbing member is made of a material whose hardness is smaller than that of quartz, and a surface of the shock-absorbing member is coated with at least one material selected from a group consisting of Si, $SiO_2$, $Si_3N_4$ and SiC.

Preferably, the shock-absorbing member is made of a material including carbon, and a surface of the shock-absorbing member is coated with at least one material selected from a group consisting of Si, $SiO_2$, $Si_3N_4$ and SiC.

Preferably, the shock-absorbing member is made of single-crystal silicon.

Preferably, the outer tube and the support section are made of quartz, and the support section is welded to an inner wall of the outer tube.

Preferably, the inner tube, the outer tube and the support section are made of quartz.

Preferably, at least one of the shock-absorbing member, the support section and the inner tube is provided with a step portion which restricts motion of the shock-absorbing member or the inner tube in a horizontal direction.

Preferably, the shock-absorbing member is provided with the step portion.

Preferably, each of the shock-absorbing member and the support section is provided with the step portion.

Preferably, each of the inner tube and the support section is provided with the step portion.

Preferably, each of the shock-absorbing member and the inner tube is provided with the step portion.

Another preferred embodiments of the present invention provides a substrate processing apparatus, comprising a reaction tube to process a substrate therein, wherein the reaction tube comprises an outer tube, an inner tube disposed inside the outer tube, and a support section to support the inner tube, and a shock-absorbing member is provided between the support section and the inner tube, the shock-absorbing member being made of a material which is deformed or damaged by a force smaller than a force by which materials of the support section and the inner tube are deformed or damaged.

Still another preferred embodiments of the present invention provides a producing method of a semiconductor device, comprising:

loading a substrate into a reaction tube, the reaction tube comprising an outer tube, an inner tube disposed inside the outer tube, and a support section to support the inner tube, the inner tube and the support section being made of quartz or silicon carbide, and a shock-absorbing member being provided between the support section and the inner tube;

forming a film on the substrate by supplying film-forming gas into the reaction tube using a CVD method; and unloading the substrate on which the film is formed from the reaction tube.

Next, preferred embodiments of the present invention will be explained in detail with reference to the drawings.

In the preferred embodiments of the present invention, a conventional outer tube 205 and an inlet flange (manifold) 209 are integrally formed as one unit, and the unit is entirely made of quartz.

A shock-absorbing member 272 is provided between an inner tube 204 and a portion 271 of the outer tube 205 which supports the inner tube 204 so that quartz members do not come into contact with each other.

(Embodiment 1)

Figure 1:
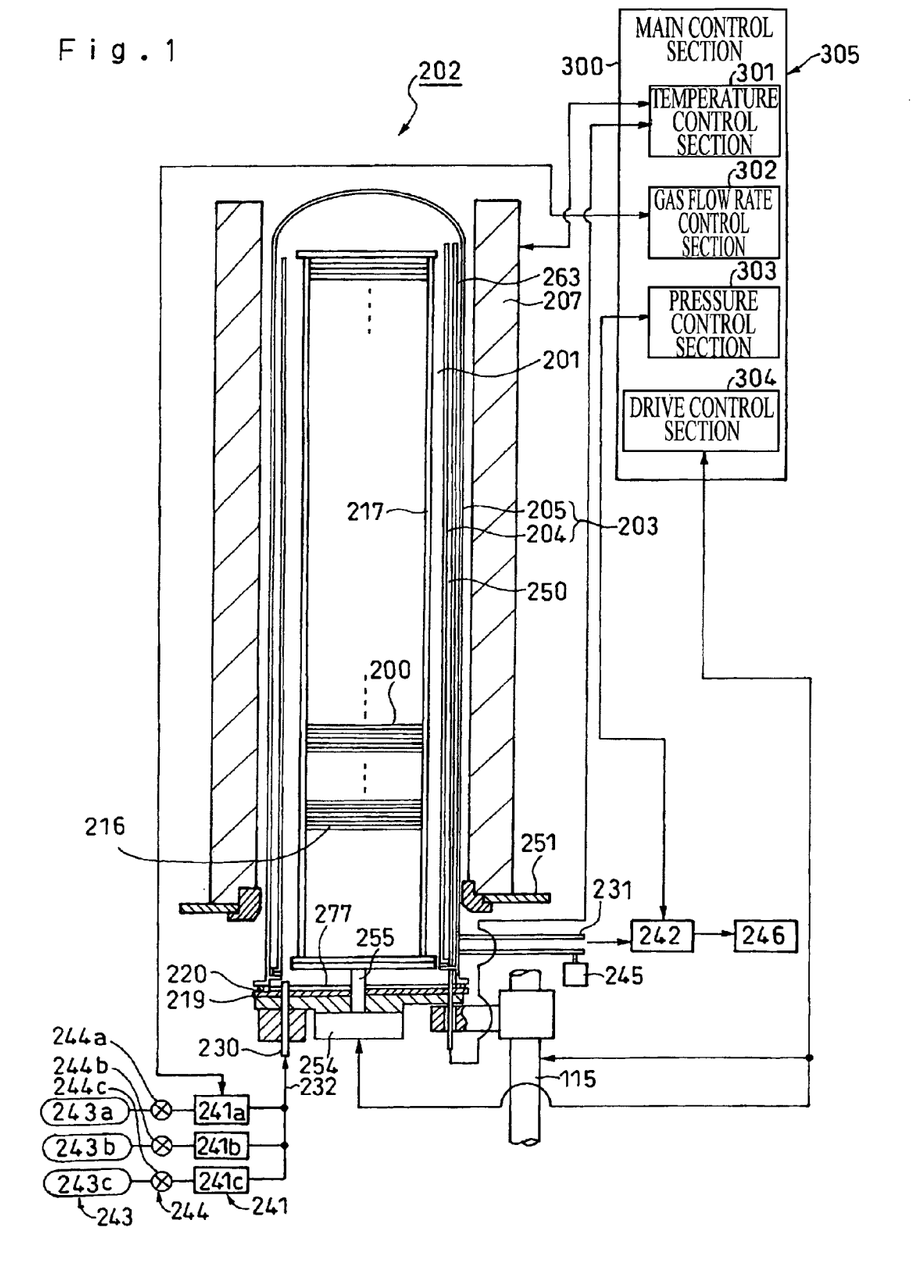
FIG. 1 is a schematic vertical sectional view for explaining a vertical type pressure reducing CVD apparatus according to an embodiment 1 of the present invention.
Figure 2:
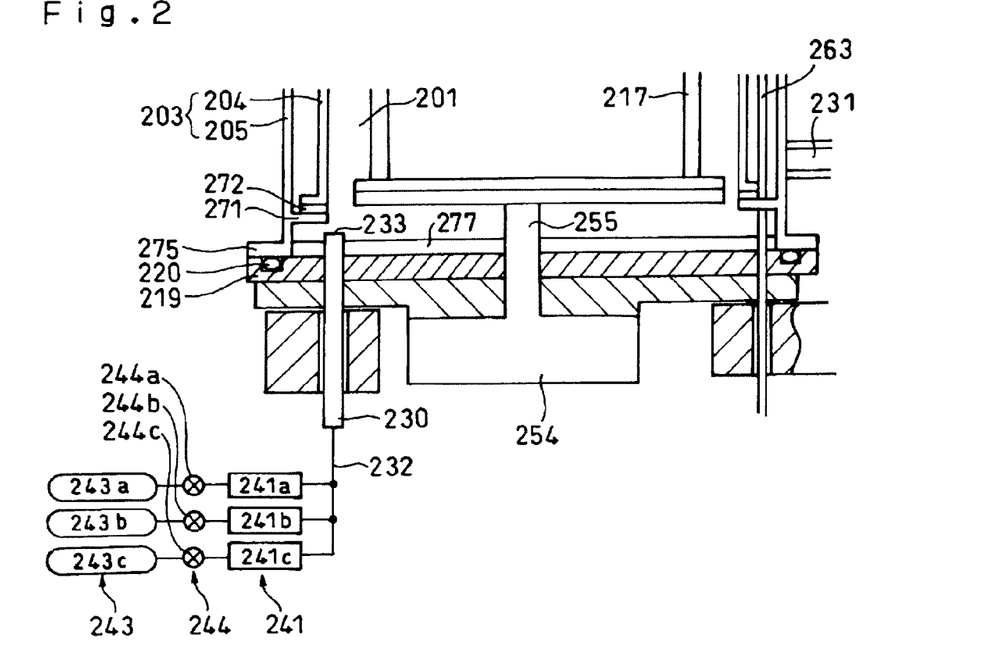
FIG. 2 is a partially enlarged schematic vertical sectional view for explaining the vertical type pressure reducing CVD apparatus of the embodiment 1 of the present invention.

FIG. 1 is a schematic vertical sectional view for explaining a vertical type pressure reducing CVD apparatus according to an embodiment 1 of the present invention. FIG. 2 is a partially enlarged schematic vertical sectional view for explaining the vertical type pressure reducing CVD apparatus of the embodiment 1. In the drawings, sizes, shapes, thickness and the like of members constituting a reaction furnace are exaggerated for showing them more clearly. Much the same is true on the other embodiments.

A processing furnace 202 of the vertical type pressure reducing CVD apparatus of the embodiment 1 is controlled by a main control section 300. The main control section 300 includes a temperature control section 301, a gas flow rate control section 302, a pressure control section 303 and a drive control section 304. The main control section 300, the temperature control section 301, the gas flow rate control section 302, the pressure control section 303 and the drive control section 304 are constituted as a controller 305.

The processing furnace 202 includes a heater 207 as a heating mechanism. The heater 207 is of cylindrical shape, and is supported by a heater base 251 as a holding plate so that the heater 207 is vertically installed.

A process tube 203 as a reaction tube is provided inside the heater 207 concentrically with the heater 207. The process tube 203 includes the inner tube 204 as an inner reaction tube, and the outer tube 205 as an outer reaction tube provided outside the inner tube 204. The inner tube 204 is made of quartz ($SiO_2$) which is a heat-resistant material, and formed into a cylindrical shape. A lower end and an upper end of the inner tube 204 are opened. A processing chamber 201 is formed in a hollow portion of the cylinder of the inner tube 204. Wafers 200 as substrates are stacked in multi-layers in a vertical direction in their horizontal attitudes, and the wafers 200 can be accommodated in this state in the processing chamber 201 by a later-described boat 217. The outer tube 205 is made of quartz which is a heat-resistant material. The outer tube 205 is formed into a cylindrical shape, an upper end of the outer tube 205 is closed and a lower end thereof is opened. An inner diameter of the outer tube 205 is greater than an outer diameter of the inner tube 204. The outer tube 205 is provided concentrically with the inner tube 204. The inner tube 204 may be made of silicon carbide (SiC) which is a heat-resistant material. If the inner tube 204 is made of silicon carbide, a difference between a coefficient of thermal expansion of films deposited on the inner tube 204 and a coefficient of thermal expansion of the inner tube 204 can be reduced in some cases, and accumulated film thickness until particles are generated can be increased in some cases. The outer tube 205 may also be made of silicon carbide, but if temperature control performance is taken into account, it is preferable that the outer tube 205 is made of quartz.

A lower end of the outer tube 205 is provided with an annular flange 275. A seal cap 219 as a furnace opening lid is detachably provided on a lower end opening of the outer tube 205 such that the lower end opening can air-tightly be sealed through an O-ring 220 as a seal member. The seal cap 219 abuts on the lower end of the outer tube 205 from below in the vertical direction. The seal cap 219 is made of metal such as stainless steel, and is formed into a disk-shape. The O-ring 220 is mounted on a periphery of an upper face of the seal cap 219.

An annular inner tube support section 271 projects inward from a lower sidewall of the outer tube 205. The inner tube support section 271 is also made of quartz. The inner tube support section 271 is welded to an inner wall of the outer tube 205. The inner tube support section 271 have a certain thickness to secure strength. For example, when the thickness of the outer tube 205 is about several mm, the thickness of the inner tube support section 271 is several mm or more, preferably more than twice that of the outer tube 205, more preferably about 10 mm. The inner tube 204 is mounted on the inner tube support section 271. The annular shock-absorbing member 272 is provided between the inner tube support section 271 and the inner tube 204. That is, the shock-absorbing member 272 is mounted on the inner tube support section 271, and the inner tube 204 is mounted on the shock-absorbing member 272.

Preferably, a Liner is used as the shock-absorbing member 272. A soft material (having smaller hardness than quartz) is used as the Liner material so as to prevent the quartz members from being broken by contact therebetween, and a material having lubricity is used as the Liner material so that the outer tube 205 and the inner tube 204 can easily be attached to and detached from each other. An inexpensive material which can easily be machined and exchanged when damaged is preferable for the Liner. A Liner material, which does not contaminate the process when it is broken in the furnace, such as carbon (graphite) of high purity is preferable.

The shock-absorbing member 272 is preferably made of a material which is deformed or damaged by a force smaller than a force by which quartz is deformed or damaged. When a force is applied, the shock-absorbing member 272 is deformed or damaged before quartz and thus, it is possible to prevent the quartz member from being deformed or damaged. If a material is deformed or damaged by a force smaller than a force by which quartz is deformed or damaged, the material is deformed or damaged by a force smaller than a force by which SiC is deformed or damaged and thus, even when at least one of the outer tube 205 and the inner tube 204 is SiC, the same effect can be obtained.

The shock-absorbing member 272 is preferably made of a material whose hardness is smaller than that of quartz.

The shock-absorbing member 272 may be made of single-crystal silicon. The hardness of the single-crystal silicon is equal to or higher than that of quartz, but when a force is applied, the single-crystal silicon is deformed or damaged by a force smaller than a force by which quartz is deformed or damaged in some cases due to the single-crystal structure. Thus, the single-crystal silicon can be used as the shock-absorbing member.

The shock-absorbing member 272 is preferably made of a material including carbon (C) or a material including silicon (Si) as a material whose hardness is smaller than that of quartz.

More preferably, the shock-absorbing member 272 is made of at least one material selected from a group consisting of graphite, glassy carbon and graphite having a surface covered with glassy carbon. The glassy carbon generates a small amount of particles.

The shock-absorbing member 272 may be formed of a member made of a material whose hardness is smaller than that of quartz, and a surface of the material is coated with at least one material selected from a group consisting of Si, $SiO_2$, $Si_3N_4$ and SiC.

Hardness of each of Si, $SiO_2$, $Si_3N_4$ and SiC is equal to or higher than that of quartz, but if the thickness of a material to coat is reduced, the hardness as the entire shock-absorbing member can be closer to hardness of foundation (a material to be coated). That is, if a material whose hardness is smaller than that of quartz is thinly coated with a material such as Si, $SiO_2$, $Si_3N_4$ and SiC, the hardness of the entire shock-absorbing member can be made smaller than that of the material to coat, and can be closer to the hardness of the foundation that is "a material whose hardness is smaller than that of quartz".

The Liner material may be formed of a member made of a material including carbon (C), and a surface of the material is coated with at least one material selected from a group consisting of Si, $SiO_2$, $Si_3N_4$ and SiC.

Table 1 shows Vickers hardness of quartz, graphite, glassy carbon, graphite whose surface is covered with glassy carbon, Si, $SiO_2$, $Si_3N_4$ and SiC.

TABLE 1

| Material | Vickers hardness (kgf/mm$^2$) |
|---|---|
| Quartz | 950~1000 |
| Graphite | 200~250 |
| Glassy carbon | 400~500 |
| Graphite whose surface is covered with glassy carbon | About 250 |
| Silicon (Si) | 1000~1050 |
| Silicon oxide ($SiO_2$) | 950~1000 |
| Silicon nitride ($Si_3N_4$) | About 1400 |
| Silicon carbide (SiC) | About 2500 |

It is preferable that the thickness of the shock-absorbing member 272 is 3 mm to 4 mm or more, and 10 mm or less.

The seal cap 219 is made of metal, but a quartz cover 277 is provided on the seal cap 219 so that the metal seal cap 219 is not exposed in the processing chamber 201.

A nozzle 230 as a gas introducing portion is connected to the seal cap 219 such that the nozzle 230 is in communication with the processing chamber 201. A gas supply tube 232 is connected to the nozzle 230. The nozzle 230 is provided such that it is located below the inner tube 204. Gas is supplied into the inner tube 204 from a gas supply port 233 formed at a tip end of the nozzle 230. A gas supply source 243 is connected to an upstream side of the gas supply tube 232, which is opposite side from a connection side with the nozzle 230, through an MFC (mass flow controller) 241 as a gas flow rate controller, and a valve 244. For example, a first processing gas supply source 243a, a second processing gas supply source 243b and a cleaning gas supply source 243c are connected to the gas supply tube 232 through an MFC 241a, an MFC 241b, an MFC 241c, a valve 244a, a valve 244b and a valve 244c. An inert gas supply source (not shown) is also connected to the gas supply tube 232. Processing gas, i.e., film-forming gas and cleaning gas are supplied from the nozzle 230. Gas including halogen is also supplied from the nozzle 230. Gas including halogen may be film-forming gas such as dichlorosilane ($SiH_2Cl_2$) in some cases, and may be cleaning (etching) gas such as nitrogen trifluoride ($NF_3$) in some cases. The gas flow rate control section 302 is electrically connected to the MFC 241 (MFC 241a, MFC 241b, MFC 241c), and the gas flow rate control section 302 controls such that a flow rate of gas to be supplied becomes a desired value at a desired timing. The nozzle 230 is commonly provided for a plurality of gas kinds, but nozzles may be provided for respective gas kinds. The nozzle 230 may be provided on a sidewall lower than the inner tube support section 271 of the outer tube 205.

Gas supplied from a lower portion of the inner tube 204 moves upward in the inner tube 204 and then passes through (moves downward) a cylindrical space 250 from an upper opening of the inner tube 204 and is exhausted from an exhaust pipe 231.

The exhaust pipe 231 through which atmosphere in the processing chamber 201 is to be exhausted is provided on a lower sidewall of the outer tube 205. The exhaust pipe 231 is disposed at a lower end of the cylindrical space 250 formed by a gap between the inner tube 204 and the outer tube 205, and the exhaust pipe 231 is in communication with the cylindrical space 250. A vacuum pump 246 as a vacuum exhaust device is connected to a downstream side of the exhaust pipe 231, which is opposite side from a connection side with respect to the outer tube 205, through a pressure sensor 245 as a pressure detector and a pressure adjuster 242 (here, APC 242) such as an APC and a $N_2$ ballast controller, so that gas can be exhausted such that pressure in the processing chamber 201 becomes equal to predetermined pressure (degree of vacuum). The pressure control section 303 is electrically connected to the APC 242 and the pressure sensor 245. The pressure control section 303 controls at desired timing such that pressure in the processing chamber 201 becomes equal to desired pressure based on pressure detected by the pressure sensor 245.

A rotation mechanism 254 for rotating the later-described boat 217 is disposed on the side of the seal cap 219 opposite from the processing chamber 201. A rotation shaft 255 of the rotation mechanism 254 passes through the seal cap 219 and is connected to the boat 217, and the wafers 200 are rotated by rotating the boat 217. The seal cap 219 is moved upward and downward in the vertical direction by a boat elevator 115 as an elevator mechanism which is vertically disposed outside the process tube 203. With this, the boat 217 can be brought into and out from the processing chamber 201. The drive control section 304 is electrically connected to the rotation mechanism 254 and the boat elevator 115, and the drive control section 304 controls them at desired timing such that they carry out desired operations.

The boat 217 as a substrate holding tool is made of a heat-resistant material such as quartz and silicon carbide. The boat 217 holds a plurality of wafers 200 in such a state where the wafers 200 are stacked in multi-layers in the vertical direction in their horizontal attitudes and centers of the wafers 200 are aligned to each other. A plurality of disk-like heat insulating boards 216 as heat insulating members, which are made of a heat-resistant material such as quartz and silicon carbide, are disposed in multi-layers in their horizontal attitudes on a lower portion of the boat 217 so that heat is not easily transmitted from the heater 207 to the seal cap 219.

A temperature sensor 263 such as a thermocouple is disposed in the process tube 203 as a temperature detector. The temperature control section 301 is electrically connected to the heater 207 and the temperature sensor 263. The temperature control section 301 controls at desired timing such that temperature in the processing chamber 201 becomes desired temperature distribution by adjusting a current-carrying degree to the heater 207 based on temperature information detected by the temperature sensor 263.

Next, a method for forming a film on the wafer 200 by a CVD method using the processing furnace 202 having the above-described structure will be explained as one step of a producing step of a semiconductor device. In the following explanation, actions of various members constituting the substrate processing apparatus are controlled by the controller 305.

When the plurality of wafers 200 are charged onto the boat 217 (wafer charge), the boat 217 holding the wafers 200 is lifted up by the boat elevator 115 and is loaded into the processing chamber 201 (boat loading) as shown in FIG. 1. In this state, the seal cap 219 seals the lower end of the outer tube 205 through the O-ring 220.

The processing chamber 201 is evacuated to desired pressure (degree of vacuum) by the vacuum pump 246. At that time, the pressure in the processing chamber 201 is measured by the pressure sensor 245, and the APC 242 is feedback controlled based on the measured pressure. The inside of the processing chamber 201 is heated by the heater 207 to desired temperature. At that time, the current-carrying degree to the heater 207 is feedback controlled based on the temperature information detected by the temperature sensor 263 such that the temperature in the processing chamber 201 becomes the desired temperature distribution. Then, the boat 217 is rotated by the rotation mechanism 254, thereby the wafers 200 are rotated.

Next, gas which is supplied from the processing gas supply source 243 and controlled such that a flow rate of the gas becomes equal to a desired value by the MFC 241 flows through the gas supply tube 232 and is introduced into the processing chamber 201 from the nozzle 230. For example, first processing gas and second processing gas, which are supplied from the first processing gas supply source 243a and the second processing gas supply source 243b and whose flow rates are controlled to desired values by the MFC 241a and MFC 241b, flow through the gas supply tube 232 and are introduced into the processing chamber 201 from the nozzle 230. The introduced processing gas flows upward in the processing chamber 201, flows out into the cylindrical space 250 from the upper end opening of the inner tube 204 and is exhausted from the exhaust pipe 231. When the processing gas passes through the processing chamber 201, the processing gas comes into contact with surfaces of the wafers 200 and at that time, thin films are deposited on the surfaces of the wafers 200 by the thermal CVD reaction.

If preset processing time is elapsed, inert gas is supplied from the inert gas supply source, gas in the processing chamber 201 is replaced by the inert gas, and the pressure in the processing chamber 201 is returned to normal pressure.

Then, the seal cap 219 is lowered by the boat elevator 115, the lower end of the outer tube 205 is opened and the processed wafers 200 are unloaded outside the process tube 203 from the lower end of the outer tube 205 in a state where the processed wafers 200 are held by the boat 217 (boat unloading). Then, the processed wafers 200 are discharged from the boat 217 (wafer discharge). After the processed wafers 200 are discharged, non-processed wafers 200 are charged onto the boat 217 (wafer charge) and are loaded into the processing chamber 201 (boat loading) as in the same manner as described above, and the wafers 200 are processed.

For example, when $Si_3N_4$ films are to be formed, examples of processing conditions when wafers are processed in the processing furnace of this embodiment are as follows: the processing temperature is in a range of 650 to 800° C., the processing pressure is in a range of 20 to 130 Pa, a flow rate of the first processing gas ($SiH_2Cl_2$) is in a range of 200 to 500 sccm, and a flow rate of the second processing gas ($NH_3$) is in a range of 800 to 5000 sccm. The wafers are processed by maintaining these processing conditions at constant values within these ranges.

When $SiO_2$ films are to be formed as HTO (High Temperature Oxide) films, examples of processing conditions are as follows: the processing temperature is in a range of 700 to 800° C., the processing pressure is in a range of 20 to 50 Pa, a flow rate of the first processing gas ($SiH_2Cl_2$) is in a range of 100 to 200 sccm, and a flow rate of the second processing gas ($N_2O$) is in a range of 800 to 5000 sccm. The wafers are processed by maintaining these processing conditions at constant values within these ranges.

If the above-described film forming operation is repeated, a film is adhered to the inner wall and the like of the reaction tube 203, but when the thickness of the film adhered to the inner wall and the like reaches a predetermined value, cleaning in the reaction tube 203 is carried out.

The cleaning is carried out in the following manner.

A vacant boat 217, i.e., a boat 217 onto which no wafer 200 is charged, is lifted by the boat elevator 115 and loaded into the processing chamber 201 (boat loading). In this state, the seal cap 219 seals the lower end of the outer tube 205 through the O-ring 220.

The processing chamber 201 is evacuated to a desired pressure (degree of vacuum) by the vacuum pump 246. At that time, the pressure in the processing chamber 201 is measured by the pressure sensor 245, and the APC 242 is feedback controlled based on the measured pressure. The inside of the processing chamber 201 is heated by the heater 207 to a desired temperature. At that time, the current-carrying degree to the heater 207 is feedback controlled based on the temperature information detected by the temperature sensor 263 such that the temperature in the processing chamber 201 becomes equal to a desired temperature distribution. Next, the boat 217 is rotated by the rotation mechanism 254. The boat 217 may not be rotated.

Next, Cleaning gas such as halogen-based gas, which is supplied from the cleaning gas supply source 243c and whose flow rate is controlled to a desired value by the MFC 241c, flows through the gas supply tube 232 and is introduced into the processing chamber 201 from the nozzle 230. The introduced halogen-based gas flows upward in the processing chamber 201, and flows out from the upper end opening of the inner tube 204 and is exhausted from the exhaust pipe 231. The cleaning in the processing chamber 201 is carried out in this manner. When the cleaning gas passes through the processing chamber 201, the cleaning gas comes into contact with the inner wall of the reaction tube 203 and the film deposited on the boat 217, and the film is removed (cleaned) by the thermal reaction during that time.

If preset cleaning time is elapsed, inert gas is supplied from the inert gas supply source, and gas in the processing chamber 201 is replaced by inert gas.

The cleaning conditions are as follows: cleaning temperature is in a range of 500 to 650° C., cleaning pressure is in a range of 100 to 20000 Pa, and a flow rate of cleaning gas ($NF_3$) is in a range of 1 to 5 l/min. These cleaning conditions are maintained at constant values within these ranges, and the cleaning operation is carried out.

If the film forming and the cleaning are repeated, the shock-absorbing member 272 may be deformed, damaged or worn in some cases. In such a case, the shock-absorbing member 272 is replaced by new one. The shock-absorbing member 272 is replaced by new one in the following manner.

Figure 3A:
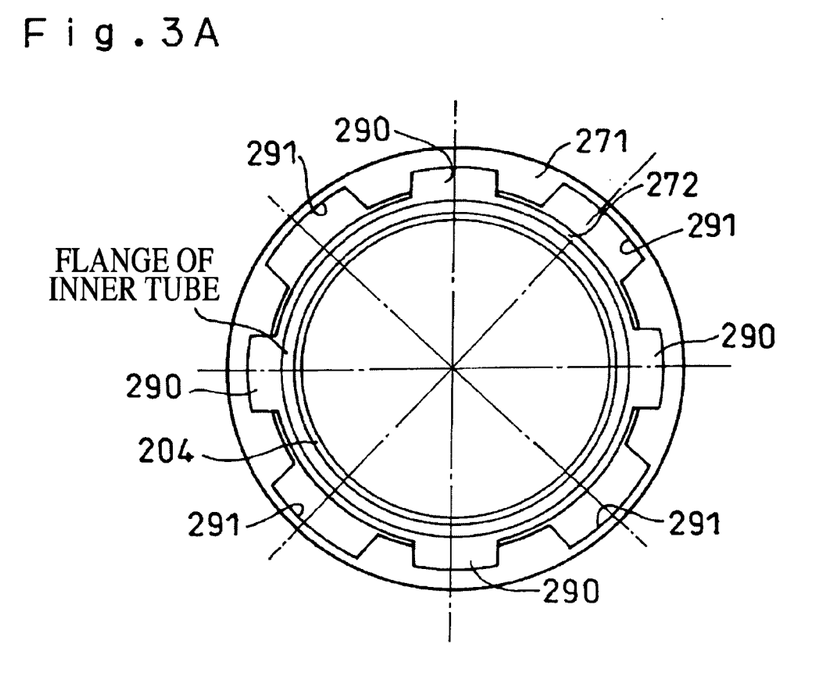
FIG. 3A is a schematic transverse sectional view for explaining an exchanging method of a shock-absorbing member of the vertical type pressure reducing CVD apparatus of the embodiment 1 of the present invention.
Figure 3B:
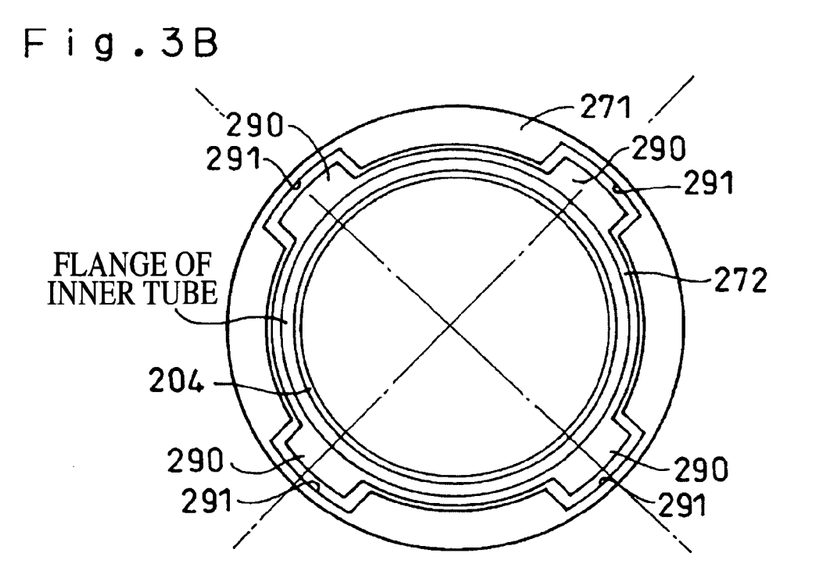
FIG. 3B is a schematic transverse sectional view for explaining an exchanging method of a shock-absorbing member of the vertical type pressure reducing CVD apparatus of the embodiment 1 of the present invention.

FIGS. 3A and 3B shows an exchanging method of the shock-absorbing member 272, and are top views of the inner tube support section 271, the shock-absorbing member 272 and the inner tube 204. For the sake of convenience, only the inner tube support section 271, the shock-absorbing member 272 and the inner tube 204 are shown.

As shown in FIG. 3A, the shock-absorbing member 272 is provided with a plurality of (four in this embodiment) pawls 290, and the inner tube support section 271 is provided with a plurality of (four in this embodiment) notches 291 corresponding to the pawls 290. In a state where the inner tube 204 is disposed on the inner tube support section 271 through the shock-absorbing member 272 as shown in FIG. 2, the pawls 290 of the shock-absorbing member 272 are not superposed on the notches 291 of the inner tube support section 271 as shown in FIG. 3A. That is, the pawls 290 are placed on portions of the inner tube support section 271 other than the notches 291. A ring member (not shown) is mounted on a back surface of the inner tube support section 271 for closing the notches 291 of the inner tube support section 271 and a gap between the inner tube support section 271 and the shock-absorbing member 272. In this state, the film forming and the cleaning are repeated.

When the shock-absorbing member 272 is exchanged, the ring member (not shown) mounted on the back surface of the inner tube support section 271 is detached, the inner tube 204 is placed on the shock-absorbing member 272 and in this state, the shock-absorbing member 272 and the inner tube 204 are rotated by a predetermined angle. If the shock-absorbing member 272 is rotated by the predetermined angle, the pawls 290 of the shock-absorbing member 272 and the notches 291 of the inner tube support section 271 are superposed on each other as shown in FIG. 3B. That is, the pawls 290 are not placed on the inner tube support section 271.

By pulling out the shock-absorbing member 272 downward in this state, the shock-absorbing member 272 and the inner tube 204 are taken out from the outer tube 205. When the shock-absorbing member 272 is pulled out downward, the boat elevator 115 may be used. After the shock-absorbing member 272 and the inner tube 204 are taken out from the outer tube 205, the shock-absorbing member 272 is replaced by new one.

After the shock-absorbing member 272 is replaced by new one, the inner tube 204 is placed on the new shock-absorbing member 272 and in this state, the new shock-absorbing member 272 is moved upward, and the inner tube 204 and the new shock-absorbing member 272 are placed on the inner tube support section 271 following the reverse procedure to the above. Thereafter, the above-described ring member (not shown) is mounted on the back surface of the inner tube support section 271, thereby the notches 291 of the inner tube support section 271 and the gap between the inner tube support section 271 and the shock-absorbing member 272 are occluded.

When the shock-absorbing member 272 and the inner tube 204 are detached or disposed, the shock-absorbing member 272 is allowed to slip on the inner tube support section 271 while rotating the shock-absorbing member 272 on the inner tube support section 271. Also when the positions of the shock-absorbing member 272 and the inner tube 204 are finely adjusted after the shock-absorbing member 272 and the inner tube 204 are disposed, the shock-absorbing member 272 is allowed to slip on the inner tube support section 271 and the inner tube 204 is allowed to slip on the shock-absorbing member 272. In such a case, if the shock-absorbing member is not provided between the inner tube 204 and the inner tube support section 271, or if the shock-absorbing member is made of a hard material having poor lubricity even if the shock-absorbing member is provided between the inner tube 204 and the inner tube support section 271, these members do not easily slip each other or the inner tube 204 or the inner tube support section 271 may be damaged in some cases. In this embodiment, however, the shock-absorbing member 272 has excellent lubricity and is made of a material which is deformed or damaged by a force smaller than a force by which quartz is deformed or damaged, and this shock-absorbing member 272 is provided between the inner tube 204 and the inner tube support section 271. Therefore, these members can easily slip each other, easily be detached or installed, and positions of the members can easily be adjusted finely. Moreover, it is possible to prevent the inner tube 204 and the inner tube support section 271 from being damaged when they are detached or installed or their positions are finely adjusted.

In the above-explained preferred embodiment of the present invention, since the metal flange is eliminated, the metal contamination material concentration can be suppressed to $1E10/cm^2 (1\times10^{10}/cm^2)$ or less at an early stage in the initial rising stage of the vertical type CVD apparatus which is used under the high temperature and corrosive gas conditions. Even if this apparatus is used for a long term, metal contamination of $1E10/cm^2 (1\times10^{10}/cm^2)$ or higher is not generated.

If the Liner 272 is used, the durability of each of the outer tube 205 and the inner tube 204 is remarkably enhanced, and the operation cost for long term can be reduced.

Figure 4:
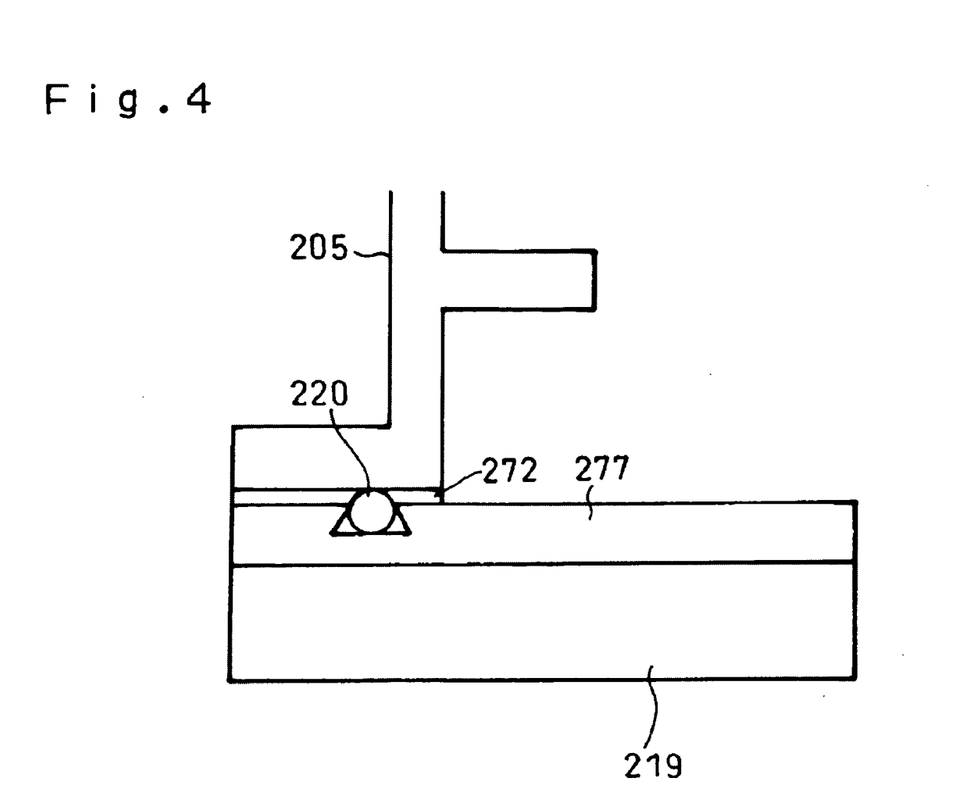
FIG. 4 is a schematic transverse sectional view for explaining a case in which a lower end of an outer tube is provided with the shock-absorbing member in the vertical type pressure reducing CVD apparatus of the embodiment 1 of the present invention.

It is conceived that the present invention is applied to a seal portion of the lower end of the outer tube 205 in this embodiment. That is, as shown in FIG. 4, it is conceived that the quartz cover 277 is extended to the outer periphery of the metal seal cap 219 and the shock-absorbing member 272 is provided between the quartz cover 277 and the lower end of the quartz outer tube 205. However, when the reaction tube is evacuated, an extremely strong force is applied to this portion, and if such structure is employed, the possibility that at least any one of the shock-absorbing member 272, the quartz cover 277 and the outer tube 205 is damaged is high, and it is considered difficult to apply the present invention to this portion.

(Embodiment 2)

Figure 5A:
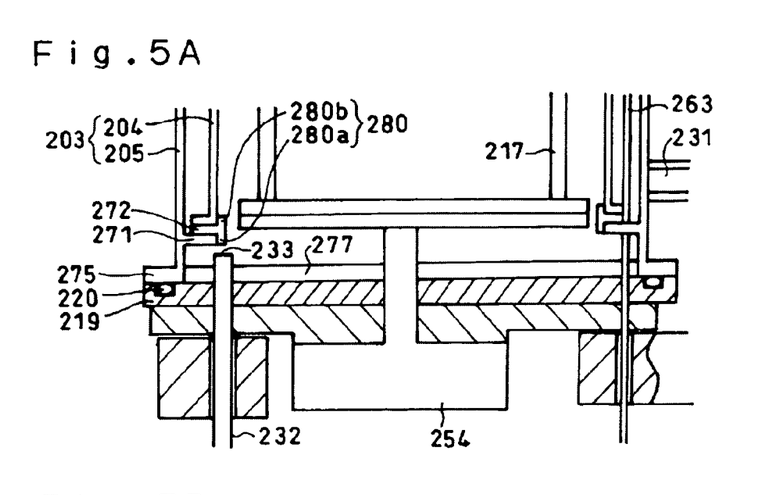
FIG. 5A is a partially enlarged schematic vertical sectional view for explaining a vertical type pressure reducing CVD apparatus according to a first example of an embodiment 2 of the present invention.
Figure 5B:
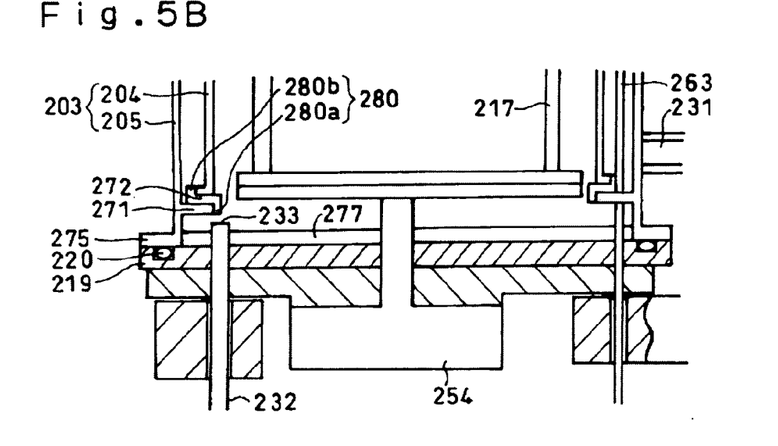
FIG. 5B is a partially enlarged schematic vertical sectional view for explaining a vertical type pressure reducing CVD apparatus according to a second example of the embodiment 2 of the present invention.
Figure 5C:
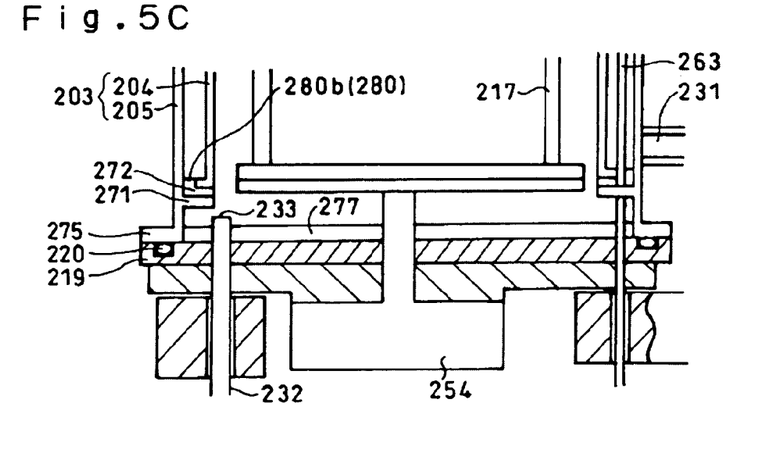
FIG. 5C is a partially enlarged schematic vertical sectional view for explaining a vertical type pressure reducing CVD apparatus according to a third example of the embodiment 2 of the present invention.

FIGS. 5A to 5C are partially enlarged schematic vertical sectional views for explaining a vertical type pressure reducing CVD apparatus of an embodiment 2 of the present invention. FIG. 5A shows a first example of the embodiment 2, FIG. 5B shows a second example of the embodiment 2 and FIG. 5C shows a third example of the embodiment 2.

The embodiment 2 is different from the embodiment 1 in that at least any one of the shock-absorbing member 272, the outer tube 205 and the inner tube 204 is provided with a step portion 280 which restricts motion of the shock-absorbing member 272 or the inner tube 204 in a horizontal direction. In the embodiment 2, the motion of the shock-absorbing member 272 and the inner tube 204 in the horizontal direction is restricted by providing the step portion 280 only on the shock-absorbing member 272.

More specifically, as shown in FIG. 5A, projecting step portions 280a and 280b are respectively provided on a lower surface inner peripheral edge and an upper surface inner peripheral edge of the shock-absorbing member 272. The step portion 280a restricts motion of the shock-absorbing member 272 in the horizontal direction with respect to the portion 271 of the outer tube 205 which supports the inner tube 204. The step portion 280b restricts motion of the inner tube 204 in the horizontal direction with respect to the shock-absorbing member 272.

With this structure, it is possible to restrict the motion of the shock-absorbing member 272 and the inner tube 204 in the horizontal direction, and to prevent the shock-absorbing member 272 and the inner tube 204 from deviating in the horizontal direction. With this structure also, it is possible to easily position the shock-absorbing member 272 and the inner tube 204.

As shown in FIG. 5B, projecting step portions 280a and 280b may be respectively provided on a lower surface inner peripheral edge and an upper surface outer peripheral edge of the shock-absorbing member 272. With this structure also, the same effect can be obtained. As shown in FIG. 5C, an outer periphery of the shock-absorbing member 272 may be extended to a location near an inner wall of the outer tube 205, and a projecting step portion 280b may be provided on the upper surface outer peripheral edge of the shock-absorbing member 272. With this structure also, the same effect can be obtained. In this case, motion of the shock-absorbing member 272 in the horizontal direction is restricted by the inner wall of the outer tube 205.

(Embodiment 3)

Figure 6A:
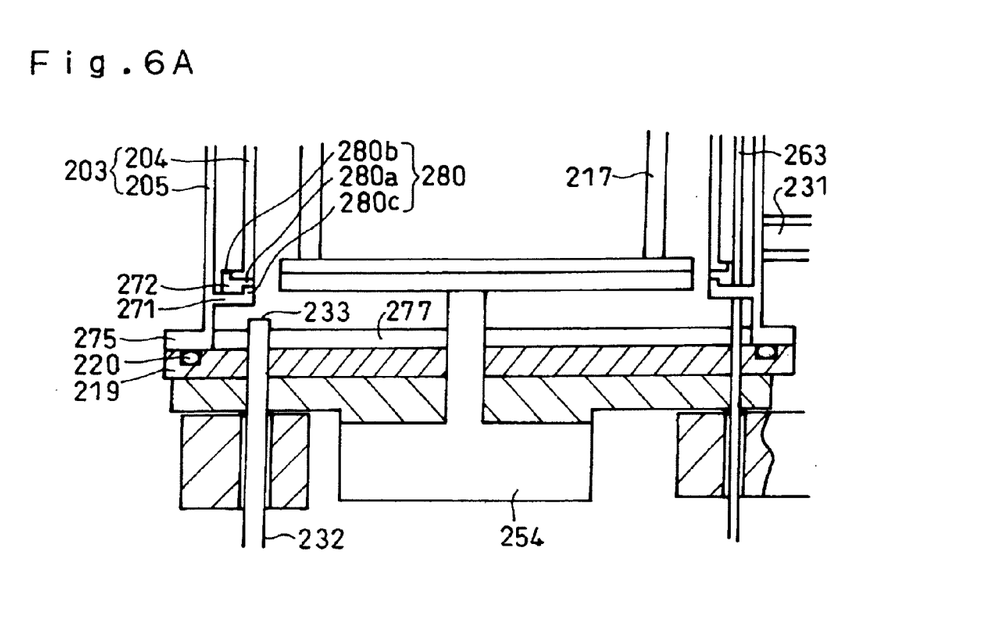
FIG. 6A is a partially enlarged schematic vertical sectional view for explaining a vertical type pressure reducing CVD apparatus according to a first example of an embodiment 3 of the present invention.
Figure 6B:
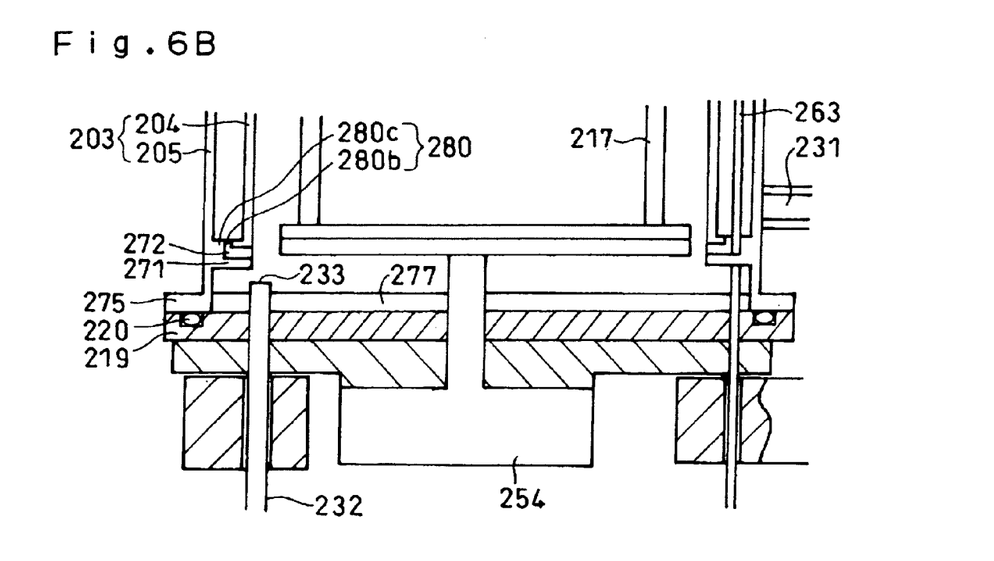
FIG. 6B is a partially enlarged schematic vertical sectional view for explaining a vertical type pressure reducing CVD apparatus according to a second example of the embodiment 3 of the present invention.

FIGS. 6A and 6B are partially enlarged schematic vertical sectional views for explaining a vertical type pressure reducing CVD apparatus of an embodiment 3 of the present invention. FIG. 6A shows a first example of the embodiment 3, and FIG. 6B shows a second example of the embodiment 3.

The embodiment 3 is different from the embodiment 1 in that at least any one of the shock-absorbing member 272, the outer tube 205 and the inner tube 204 is provided with a step portion 280 which restricts motion of the shock-absorbing member 272 or the inner tube 204 in the horizontal direction. In the embodiment 3, the motion of the shock-absorbing member 272 and the inner tube 204 in the horizontal direction is restricted by providing the step portion 280 on the shock-absorbing member 272 and the outer tube 205.

More specifically, as shown in FIG. 6A, a recessed step portion 280a is provided in the lower surface inner peripheral edge of the shock-absorbing member 272, a projecting step portion 280b is provided on the upper surface outer peripheral edge of the shock-absorbing member 272, and a projecting step portion 280c is provided on the upper surface inner peripheral edge (an upper portion of a tip end of an extending portion) of a portion of the outer tube 205 which supports the inner tube 204. The step portions 280a and 280c restrict motion of the shock-absorbing member 272 in the horizontal direction with respect to the portion 271 of the outer tube 205 which supports the inner tube 204, and the step portion 280b restricts motion of the inner tube 204 in the horizontal direction with respect to the shock-absorbing member 272.

With this structure, it is possible to restrict the motion of the shock-absorbing member 272 and the inner tube 204 in the horizontal direction, and to prevent the shock-absorbing member 272 and the inner tube 204 from deviating in the horizontal direction. With this structure also, it is possible to easily position the shock-absorbing member 272 and the inner tube 204.

As shown in FIG. 6B, a projecting step portion 280b may be provided on the upper surface outer peripheral edge of the shock-absorbing member 272, and a projecting step portion 280c may be provided on the upper surface outer peripheral edge (an upper portion of a base of the extending portion) of the portion 271 of the outer tube 205 which supports the inner tube 204. With this structure also, the same effect can be obtained.

(Embodiment 4)

Figure 7:
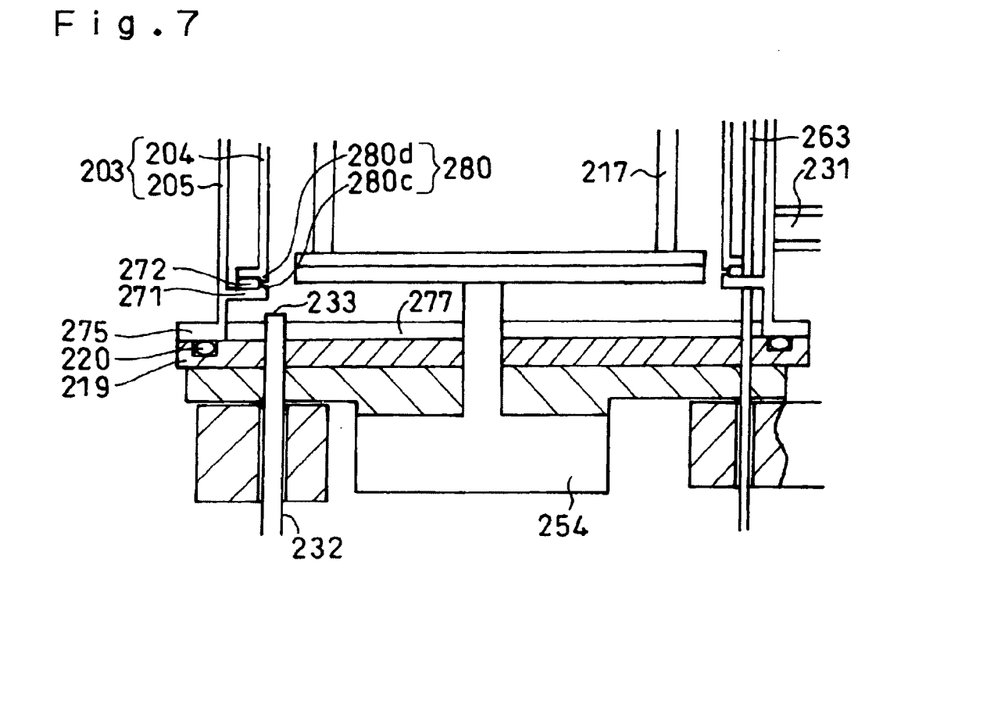
FIG. 7 is a partially enlarged schematic vertical sectional view for explaining a vertical type pressure reducing CVD apparatus according to an embodiment 4 of the present invention.

FIG. 7 is a partially enlarged schematic vertical sectional view for explaining a vertical type pressure reducing CVD apparatus according to an embodiment 4 of the present invention.

The embodiment 4 is different from the embodiment 1 in that at least any one of the shock-absorbing member 272, the outer tube 205 and the inner tube 204 is provided with a step portion 280 which restricts motion of the shock-absorbing member 272 or the inner tube 204 in the horizontal direction. In the embodiment 4, the motion of the shock-absorbing member 272 and the inner tube 204 in the horizontal direction is restricted by providing the step portion 280 on the outer tube 205 and the inner tube 204.

More specifically, as shown in FIG. 7, the shock-absorbing member 272 is not provided with a step portion, a projecting step portion 280c is provided on the upper surface inner peripheral edge (an upper portion of a tip end of the extending portion) of the portion 271 of the outer tube 205 which supports the inner tube 204, and a projecting step portion 280d is provided on the lower surface inner peripheral edge of the inner tube 204. The step portion 280d extends downward from a lower end of the inner tube 204. The step portion 280c restricts motion of the shock-absorbing member 272 in the horizontal direction with respect to the portion 271 of the outer tube 205 which supports the inner tube 204, and the step portion 280d restricts motion of the inner tube 204 in the horizontal direction with respect to the shock-absorbing member 272.

With this structure, it is possible to restrict the motion of the shock-absorbing member 272 and the inner tube 204 in the horizontal direction, and to prevent the shock-absorbing member 272 and the inner tube 204 from deviating in the horizontal direction. With this structure also, it is possible to easily position the shock-absorbing member 272 and the inner tube 204.

(Embodiment 5)

Figure 8:
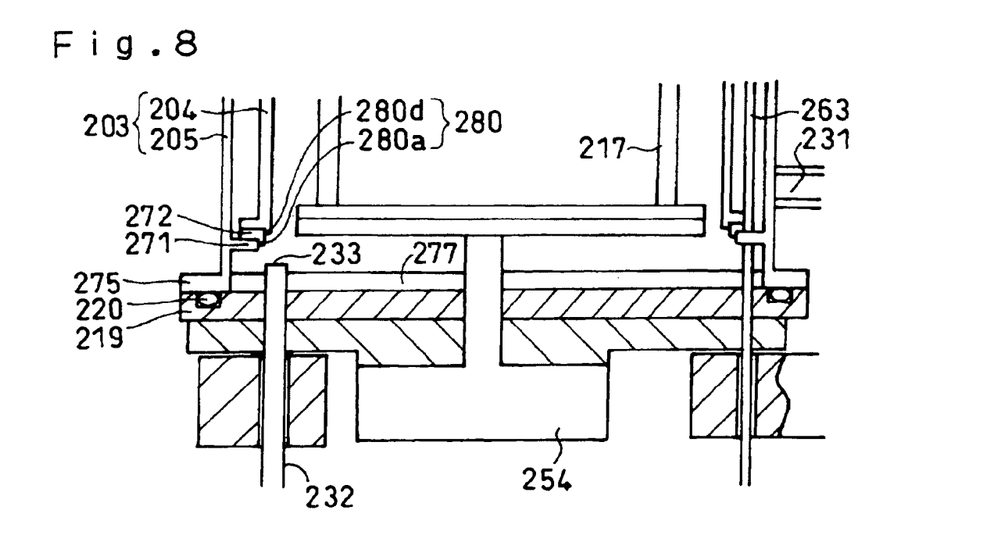
FIG. 8 is a partially enlarged schematic vertical sectional view for explaining a vertical type pressure reducing CVD apparatus according to an embodiment 5 of the present invention.

FIG. 8 is a partially enlarged schematic vertical sectional view for explaining a vertical type pressure reducing CVD apparatus according to an embodiment 5 of the present invention.

The embodiment 5 is different from the embodiment 1 in that at least any one of the shock-absorbing member 272, the outer tube 205 and the inner tube 204 is provided with a step portion 280 which restricts motion of the shock-absorbing member 272 or the inner tube 204 in the horizontal direction. In the embodiment 5, the motion of the shock-absorbing member 272 and the inner tube 204 in the horizontal direction is restricted by providing the step portion 280 on the shock-absorbing member 272 and the inner tube 204.

More specifically, as shown in FIG. 8, a projecting step portion 280a is provided on the lower surface inner peripheral edge of the shock-absorbing member 272, and a projecting step portion 280d is provided on the lower surface inner peripheral edge of the inner tube 204. The step portion 280d extends downward from a lower end of the inner tube 204. The step portion 280a restricts motion of the shock-absorbing member 272 in the horizontal direction with respect to the portion 271 of the outer tube 205 which supports the inner tube 204, and the step portion 280d restricts motion of the inner tube 204 in the horizontal direction with respect to the shock-absorbing member 272.

With this structure, it is possible to restrict the motion of the shock-absorbing member 272 and the inner tube 204 in the horizontal direction, and to prevent the shock-absorbing member 272 and the inner tube 204 from deviating in the horizontal direction. With this structure also, it is possible to easily position the shock-absorbing member 272 and the inner tube 204.

The present invention is not limited to the above embodiments, and the present invention can variously be modified and applied. For example, only the outer tube 205 may be provided with a step portion 280 which restricts motion of the shock-absorbing member 272 in the horizontal direction. Only the inner tube 204 may be provided with a step portion 280 which restricts motion of the inner tube 204 in the horizontal direction. All of the shock-absorbing member 272, the outer tube 205 and the inner tube 204 may be provided with step portions 280 which restrict motion of the shock-absorbing member 272 and the inner tube 204 in the horizontal direction.

The entire disclosures of Japanese Patent Application No. 2005-215788 filed on Jul. 26, 2005 and Japanese Patent Application No. 2006-69454 filed on Mar. 14, 2006 including specification, claims, drawings and abstract are incorporated herein by reference in their entireties.

Although various exemplary embodiments have been shown and described, the invention is not limited to the embodiments shown. Therefore, the scope of the invention is intended to be limited solely by the scope of the claims that follow.

As explained above, according to the preferred embodiments of the present invention, even if processing gas having corrosive halogen atoms is used, it is possible to prevent or suppress metal contamination. Moreover, according to the preferred embodiments of the present invention, it is possible to provide a substrate processing apparatus having a furnace opening structure having excellent durability.

As a result, the present invention can suitably be utilized for a substrate processing apparatus which processes a semiconductor silicon wafer, and a producing method of a semiconductor device.

What is claimed is:

1. A substrate processing apparatus, comprising a reaction tube to process a substrate therein, wherein
the reaction tube comprises an outer tube, an inner tube disposed inside the outer tube, and a support section to support the inner tube,
the inner tube and the support section are made of quartz or silicon carbide, and
a shock-absorbing member is provided between the support section and the inner tube.

2. The substrate processing apparatus according to claim 1, wherein the shock-absorbing member is made of a material which is deformed or damaged by a force smaller than a force by which quartz is deformed or damaged.

3. The substrate processing apparatus according to claim 2, wherein the shock-absorbing member is made of a material whose hardness is smaller than that of quartz.

4. The substrate processing apparatus according to claim 3, wherein the shock-absorbing member is made of a material including carbon or a material including silicon.

5. The substrate processing apparatus according to claim 4, wherein the shock-absorbing member is made of at least one material selected from a group consisting of graphite, glassy carbon and graphite whose surface is covered with glassy carbon.

6. The substrate processing apparatus according to claim 4, wherein the shock-absorbing member is made of a material whose hardness is smaller than that of quartz, and a surface of the shock-absorbing member is coated with at least one material selected from a group consisting of Si, $SiO_2$, $Si_3N_4$ and SiC.

7. The substrate processing apparatus according to claim 4, wherein the shock-absorbing member is made of a material including carbon, and a surface of the shock-absorbing member is coated with at least one material selected from a group consisting of Si, $SiO_2$, $Si_3N_4$ and SiC.

8. The substrate processing apparatus according to claim 2, wherein the shock-absorbing member is made of single-crystal silicon.

9. The substrate processing apparatus according to claim 1, wherein the outer tube and the support section are made of quartz, and the support section is welded to an inner all of the outer tube.

10. The substrate processing apparatus according to claim 1, wherein the inner tube, the outer tube and the support section are made of quartz.

11. The substrate processing apparatus according to claim 1, wherein at least one of the shock-absorbing member, the support section and the inner tube is provided with a step portion which restricts motion of the shock-absorbing member or the inner tube in a horizontal direction.

12. The substrate processing apparatus according to claim 11, the shock-absorbing member is provided with the step portion.

13. The substrate processing apparatus according to claim 11, wherein each of the shock-absorbing member and the support section is provided with the step portion.

14. The substrate processing apparatus according to claim 11, wherein each of the inner tube and the support section is provided with the step portion.

15. The substrate processing apparatus according to claim 11, wherein each of the shock-absorbing member and the inner tube is provided with the step portion.

16. A substrate processing apparatus, comprising a reaction tube to process a substrate therein, wherein
the reaction tube comprises an outer tube, an inner tube disposed inside the outer tube, and a support section to support the inner tube, and
a shock-absorbing member is provided between the support section and the inner tube, the shock-absorbing member being made of a material which is deformed or damaged by a force smaller than a force by which materials of the support section and the inner tube are deformed or damaged.

17. A producing method of a semiconductor device, comprising:
loading a substrate into a reaction tube, the reaction tube comprising an outer tube, an inner tube disposed inside the outer tube, and is support section to support the inner tube, the inner tube and the support section being made of quartz or silicon carbide, and a shock-absorbing member being provided between the support section and the inner tube;
processing the substrate by supplying processing gas into the reaction tube; and
unloading the processed substrate from the reaction tube.

18. A reaction tube assembly, comprising:
an outer tube;
an inner tube disposed inside the outer tube, the inner tube being made of quartz or silicon carbide;
a support section to support the inner tube, the support section being made of quartz or silicon carbide; and
a shock-absorbing member provided between the support section and the inner tube.

* * * * *